United States Patent
Loi

(10) Patent No.: US 9,379,426 B2
(45) Date of Patent: *Jun. 28, 2016

(54) SURFACE ACOUSTIC WAVE TRANSPONDER PACKAGE FOR DOWN-HOLE APPLICATIONS

(71) Applicant: HM ENERGY, LLC, Houston, TX (US)

(72) Inventor: Duke Loi, Frisco, TX (US)

(73) Assignee: HM Energy LLC, Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/676,586

(22) Filed: Apr. 1, 2015

(65) Prior Publication Data

US 2015/0207204 A1    Jul. 23, 2015

Related U.S. Application Data

(63) Continuation of application No. 13/082,996, filed on Apr. 8, 2011, now Pat. No. 9,019,119.

(60) Provisional application No. 61/366,792, filed on Jul. 22, 2010, provisional application No. 61/436,475, filed on Jan. 26, 2011, provisional application No. 61/436,918, filed on Jan. 27, 2011.

(51) Int. Cl.

| | |
|---|---|
| *G01V 3/00* | (2006.01) |
| *G08B 3/10* | (2006.01) |
| *H01L 41/00* | (2013.01) |
| *H02N 2/00* | (2006.01) |
| *H01Q 1/22* | (2006.01) |
| *E21B 17/00* | (2006.01) |
| *G06Q 10/08* | (2012.01) |
| *G06Q 50/02* | (2012.01) |
| *E21B 47/14* | (2006.01) |
| *H01Q 1/42* | (2006.01) |

(52) U.S. Cl.
CPC ............ *H01Q 1/2225* (2013.01); *E21B 17/006* (2013.01); *E21B 47/14* (2013.01); *G06Q 10/087* (2013.01); *G06Q 50/02* (2013.01); *H01Q 1/42* (2013.01); *H03H 9/02535* (2013.01); *H03H 9/25* (2013.01)

(58) Field of Classification Search
USPC .................................. 310/311–371
See application file for complete search history.

(56) References Cited

U.S. PATENT DOCUMENTS

| 7,014,100 B2 | 3/2006 | Zierolf |
| 7,602,106 B2 | 10/2009 | Mueller |

(Continued)

OTHER PUBLICATIONS

Patent Cooperation Treaty; Korean Intellectual Property Office; International Search Report and Written Opinion of PCT/US2011/044976; Han Jae Guyn; Feb. 23, 2012; 10 pages.

Patent Cooperation Treaty; the International Bureau of WIPO; International Preliminary Report on Patentability of PCT/US2011/044976; Nora Lindner; Jan. 22, 2013; 6 pages.

*Primary Examiner* — Firmin Backer
*Assistant Examiner* — Jerold Murphy
(74) *Attorney, Agent, or Firm* — Howison & Arnott, LLP

(57) ABSTRACT

A method and apparatus for packaging surface acoustic wave transponders for use in down-hole or other extreme environmental applications. An exemplary ID tag transponder may include a surface acoustic wave (SAW) piezoelectric device, wire bonds, antennae structure, an antenna reflector, a radome, and a base constructed of a conductive, non-magnetic metal or metal alloy adapted to withstand an extreme environment encountered in down-hole applications. The metallic base may have a notched lip or flange about its periphery that is adapted for pressure. An RF reflector is created inside an exemplary transponder tag device. A small amount of predetermined gas is held on top of the SAW piezoelectric device within the reflector cavity to accommodate acoustic wave propagation therein. Exemplary components of a transponder tag are enclosed and hermetically sealed within and between a radome top portion and the metallic base bottom portion.

19 Claims, 5 Drawing Sheets

(51) Int. Cl.
  *H03H 9/02* (2006.01)
  *H03H 9/25* (2006.01)

(56) References Cited

U.S. PATENT DOCUMENTS

| | | | |
|---|---|---|---|
| 8,496,184 B2 * | 7/2013 | Loi | G06K 19/0675 235/487 |
| 8,710,714 B2 * | 4/2014 | Loi | G06K 19/0675 310/313 D |
| 9,019,119 B2 * | 4/2015 | Loi | E21B 17/006 310/313 R |
| 2005/0104685 A1 | 5/2005 | Kuroki et al. | |
| 2005/0237130 A1 | 10/2005 | Iwamoto et al. | |
| 2007/0023185 A1 | 2/2007 | Hall et al. | |
| 2009/0051246 A1 | 2/2009 | Mueller | |

* cited by examiner

SURFACE ACOUSTIC WAVE TRANSPONDER PACKAGE FOR DOWN-HOLE APPLICATIONS

CROSS-REFERENCE TO RELATED APPLICATIONS

This application is a continuation of U.S. patent application Ser. No. 13/082,996, filed Apr. 8, 2011, entitled SURFACE ACOUSTIC WAVE TRANSPONDER PACKAGE FOR DOWN-HOLE APPLICATIONS, which claims benefit of U.S. Provisional Application No. 61/366,792, filed Jul. 22, 2010, entitled METHOD AND APPARATUS FOR PACKAGING SURFACE ACOUSTIC WAVE TRANSPONDER FOR HARSH ENVIRONMENT, U.S. Provisional Application No. 61/436,475, filed Jan. 26, 2011, entitled METHOD AND APPARATUS FOR PACKAGING SURFACE ACOUSTIC WAVE TRANSPONDER FOR DOWN-HOLE TOOLS, and U.S. Provisional Application No. 61/436,918, filed Jan. 27, 2011, entitled METHOD AND APPARATUS FOR PACKAGING SURFACE ACOUSTIC WAVE TRANSPONDER FOR DOWN-HOLE TOOLS, the specifications of which are incorporated herein by reference.

TECHNICAL FIELD

Embodiments of the present invention relate to methods and apparatus for packaging an identification tag circuit for use and installation on equipment assets used in oil and gas down-hole applications. More specifically, embodiments of the invention relate to methods and apparatus for packaging Surface Acoustic Wave (SAW) Radio Frequency Identification (RFID) transponders in a durable manner for use on equipment assets used in oil and gas down-hole applications.

BACKGROUND

Oil exploration companies involved in the drilling, completion and production phases of oil and gas well installations use hundreds, if not thousands, of down-hole tools such as tubulars, drill bits, mud motors, power packs, etc. while drilling, exploring and completing oil and gas wells. Some technologies have been utilized in the recent past to help such companies log individual tools into inventory; track usage of individual tools in drilling, completion and production operations; and ultimately record the removal of individual tools from inventory when their usefulness has expired.

There have been systems created for managing inventories of down-hole tools or assets that are used in the drilling, completion, and production phases of oil and gas wells. In some such systems, a passive RFID tag is installed on each asset and recorded or logged in inventory. By providing each tool or asset with an RFID tag, the asset can be tracked throughout its useful life. One example of such a system for managing inventories comprising down-hole tools used in drilling, completion and production of oil and gas wells is discussed in U.S. Publication No. 2009/0055293.

U.S. Pat. No. 7,602,106 discloses a radio frequency identification (RFID) piezoelectric device package comprising a plethora of components including a hermetically sealed device header that contains the piezoelectric device, which is then installed into the bottom of a radome along with an RF antenna, along with an impedance matching network and other elements. A drawback of such a device is the manufacturing complexity and the number of parts required to assemble the requisite piezoelectric RFID device.

As such, what is needed is an improved down-hole asset tagging device package that can withstand the high pressures, high temperatures as well as the acidic and caustic environments that exist in the down-hole portions of oil and gas wells.

SUMMARY

Embodiments of the invention provide an improved down-hole asset tagging device package that can withstand the hot temperatures and pressures as well as the acidic and caustic environments in down-hole portions of oil and gas wells.

Embodiments of the invention provide a transponder device that comprises a radome and a metallic base. The radome has cylindrical sides and a top that form an inner radome cavity. The metallic base portion comprises a circular base bottom, a notched flange positioned about the circumference of the circular base bottom, and a cylindrical side wall that extends upward from the circular base bottom. The cylindrical side wall of the metallic base portion and the cylindrical sides of the radome concentrically overlap to form an inner cavity. A circular dielectric disk is positioned inside the inner cavity. The bottom side or first side of the circular dielectric disk is positioned proximate to an inner portion bottom of the inner cavity. A second side or top side of the circular dielectric disk has an indention therein.

An exemplary transponder device may further comprise an antenna portion. The antenna portion comprises a dielectric antenna substrate. The underside or bottom of the dielectric antenna substrate is affixed to the top side or second side of the circular dielectric disk. An antenna element is located on the top side of the dielectric substrate. A first via and a second via extend from the top side of the dielectric substrate to the bottom side of a dielectric substrate. A surface acoustic wave (SAW) piezoelectric device is mounted on the underside of the dielectric antenna substrate and positioned in the indentation formed in the second side or top side of the circular dielectric disk. The SAW piezoelectric device is electrically connected to the antenna element by way of the first and second vias. Furthermore, a conductive peripheral weld is formed about at least part of the circumference of the antenna portion. The conductive peripheral weld electrically connects the antenna elements and the cylindrical side wall of the metallic base portion.

Additional embodiments of an exemplary transponder device further comprise a small amount of a predetermined gas contained in the indentation and about, at least a portion of, the SAW piezoelectric device. The predetermined gas provides a means for an acoustic wave to propagate on the SAW piezoelectric device.

Additional embodiments further comprise a hermetic seal between the radome and the metallic base portion. The hermetic seal is adapted to keep the predetermined gas inside the inner cavity formed by the radome and the metallic base portion. The predetermined gas is only needed in the indentation or cavity (between the antenna substrate and the antenna reflector) for an SAW piezoelectric device. The predetermined gas may not be needed within the cavity if no SAW piezoelectric device is incorporated into an embodiment. The hermetic seal further seals out caustic fluids, gasses or substances from entering into the inner cavity of an exemplary transponder device.

In additional embodiments of the invention, the combination of the circular dielectric disk and the inner portion bottom of the inner cavity (formed by the interior of the metallic base portion) are adapted to operate as a directional antenna reflector or RF reflector.

In other embodiments, a transponder device is provided that comprises a hermetically sealed cavity. The hermetically sealed cavity is formed within a radome top portion and a metallic base portion. Inside the hermetically sealed cavity a dielectric disk is positioned against, adjacent or proximate to the base portion on the inside of the hermetically sealed cavity. On the top side of the dielectric disk there is an indentation. An antenna portion is positioned above the dielectric disk inside the hermetically sealed cavity. The antenna portion comprises an antenna element layer, a dielectric substrate layer underneath the antenna element layer, and at least one via that extends from the dielectric substrate layer's top side to the dielectric substrate layer's bottom side. The radio frequency transponder device is mounted on the dielectric substrate layer's bottom side. A radio frequency transponder device is electrically connected to the antenna element layer though the at least one via. The bottom side of the dielectric substrate layer is attached to the top side of the dielectric disk such that the radio frequency transponder device is positioned in the indentation that is formed in the top side of the dielectric disk. A small amount of a predetermined gas fills the open area that exists between the radio frequency transponder device and the sides of the indentation.

Additional embodiments of the invention comprise a down-hole asset that comprises an annular aperture milled into an outer surface of the down-hole asset. The transponder device is press fitted in the annular aperture. The transponder device comprises a hermetically sealed cavity comprising a radome top portion and a metallic base portion. Inside the hermetically sealed cavity is an antenna portion and a radio frequency transponder. The antenna portion is positioned such that the inside of the metallic base portion is adapted to operate as a directional antenna signal reflector.

BRIEF DESCRIPTION OF THE DRAWINGS

A more complete understanding of the methods and embodiments associated with the present invention may be obtained by reference to the following Detailed Description when taken in conjunction with the accompanying drawings wherein.

DETAILED DESCRIPTION

Figure 1:
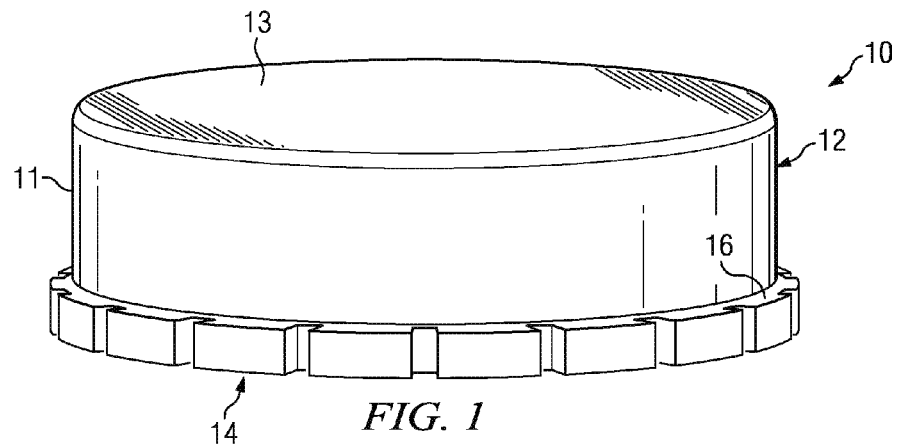
FIG. 1 depicts an exemplary ID tag.

Referring now to the drawings, wherein like reference numbers are used herein to designate like elements throughout, the various views and embodiments of surface acoustic wave transponder package for down-hole applications are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Transponders that can withstand extreme environmental conditions of pressure and temperature are critical for certain industries, such as oil and gas exploration, deep ocean exploration, space exploration and mining. Embodiments of the present ID tag device provide methods and apparatus that effectively, efficiently and economically package a surface acoustic wave (SAW) transponder for use in extreme environmental conditions such as those found in down-hole applications. Some embodiments of the invention attach a SAW piezoelectric device directly to an antenna system in a manner that is protected from such extreme environmental conditions by an integrated and hermetically sealed cavity comprising a radome top portion and a metal base portion wherein the metal base portion has a serrated or notched lip about its base structure. Additionally, embodiments incorporate components having similar coefficients of thermal expansion in order to help maintain monolithic characteristics in an exemplary ID tag over its expected wide operating temperature range.

Referring now to FIG. 1, an exemplary assembled surface acoustic wave transponder ID tag 10 is depicted. The exemplary SAW transponder ID tag 10 comprises a radio frequency transparent radome 12. The radome 12 has cylindrical sides 11 and a top surface 13. The cylindrical sides 11 and top surface 13 form an inner radome cavity (not specifically shown in this figure) that is adapted to contain various components of the exemplary ID tag 10. The radome 12 may be made of various radio frequency transparent materials including, but not limited to, a poyletheretherketone (PEEK) material or other semi crystalline thermo plastic having similar excellent mechanical and chemical resistance properties that are retained in high temperature (350°-400° C.) environments. An exemplary radome 12 may have a diameter of about 0.975 inches across the top surface 13. The base portion 14 is a metal or metal alloy chosen, like the radome 12, to be chemically resistant to sea water, hydrogen sulfide, carbon dioxide, nitrogen, bromine, chloride, down-hole drilling fluids, as well as temperatures ranging from −55° C. to over 350° C. (−67° to 662° F.). An exemplary base metal is a nickel alloy or other electrically conductive metal that meets the necessary criteria. About the bottom outer edge of the base 14 is a circumferential lip 16. An exemplary ID tag 10 may have a base diameter (including the lip 16) of about 1.005 inches. The height or thickness of the lip may be about 0.080 inches. When the radome top portion 12 and the metallic base portion 14 are engaged, as shown, the overall height or thickness of an exemplary ID tag 10 may range from about 0.250 inches to about 0.500 inches.

Figure 2A:
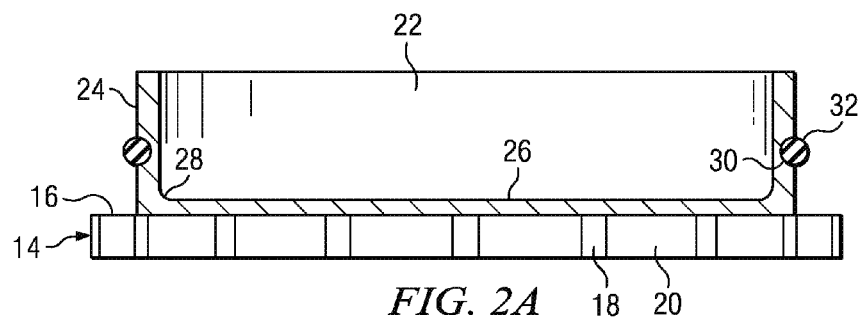
FIGS. 2A and 2B depict an exemplary base portion of an exemplary ID tag.
Figure 2B:
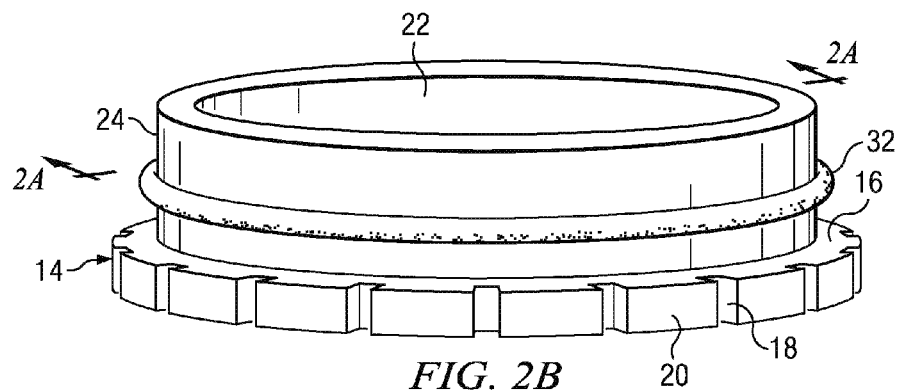

Referring now to FIGS. 2A and 2B, these figures depict a cut away and perspective view of an exemplary base portion 14, respectively. The base 14 is made of a metal or metallic alloy that has attributes of being non-magnetic, solderable, conductive, stronger than stainless steel and is adapted to withstand a caustic down-hole environment. The lip or flange 16 extends about the circumference of the bottom of the base 14. A plurality of notches 18 extend vertically or diagonally about the circumference of the lip or flange 16 in a spaced pattern. The notches 18 may be vertical, diagonal or nonlinear so long as they extend from the bottom to the top of the lip or flange 16 thereby creating a plurality of lip sections 20 spaced circumferentially about the lip or flange 16. A cylindrical side wall 24 extends upward from the top side of the bottom of the base portion 14. The cylindrical side wall has an outer circumference that is similar or concentrically smaller than the inner diameter of the cylindrical sides 11 of the radome 12. The cylindrical side wall 24 establishes an inner portion 22 bounded by the inside of the cylindrical side wall 24 and the inner portion bottom 26. At the intersection of the inside surface of the cylindrical side wall 24 and the inner portion bottom 26 a rounded inner corner 28 may be established circumferentially about the inner portion bottom 26. The rounded inner corner 28 is provided to help support the structural integrity of this stressful area by eliminating sharp corners to spread the potential stresses that may occur there over the operating pressure and temperature ranges of an exemplary ID tag 10.

A circumferential groove is spaced above the lip 16 and extends about the exterior side of the cylindrical side wall 24. In some embodiments an o-ring 32 may be seated in the circumferential groove 30 to aid in hermetically sealing the inside surface of the radome cylindrical side 11 against the cylindrical side wall 24. In other embodiments, an epoxy or other sealing material may be provided in the circumferential groove 30 and/or on the outer surface of the cylindrical side wall 24 to help hermetically seal the inside surface of the radome 12 against the outside surface of the cylindrical side wall 24. In yet additional embodiments, a paste (not specifically shown) may be applied on the o-ring 32 and the exterior surface of the cylindrical wall 24. The paste that is utilized should remain as a paste, gel or semi-viscous material over the operating temperature range of an exemplary ID tag 10 such that the paste, gel or semi-viscous material aids in providing additional sealing attributes.

Figure 3:
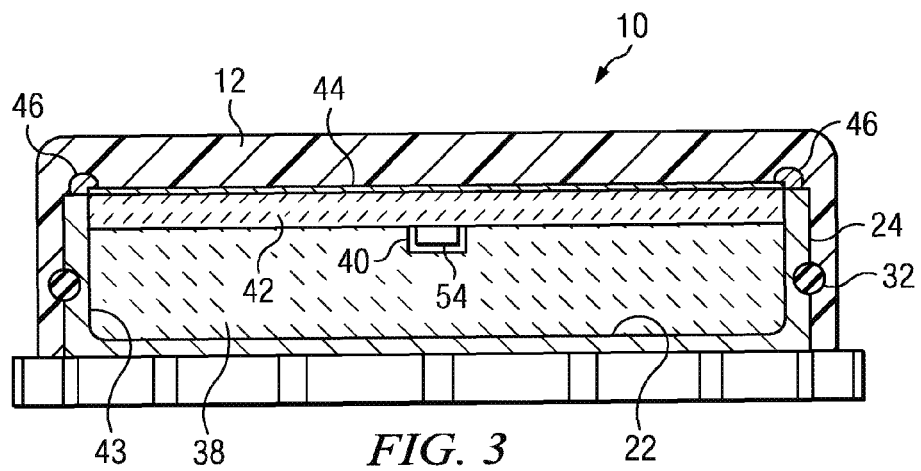
FIG. 3 depicts a side cut away view of an exemplary ID tag.

Referring now to FIG. 3, a cross sectional view of an exemplary ID tag 10 is depicted. A hermetically sealed cavity is formed when the cylindrical side wall 24 of the base portion is concentrically engaged and overlapped with the cylindrical sides 11 of the radome 12. The inner cavity 43 is substantially filled with additional ID tag elements. A dielectric disk 38, which may be made of a high-k ceramic dielectric material, is positioned on the bottom of the inner cavity 43 such that the bottom of the dielectric disk 38 is pressed against the inner portion bottom 22. The top surface of the dielectric disk 38 comprises an indentation 40, which is large enough to accommodate a SAW piezoelectric transponder device with about one to five microns of space to spare. The one to two micron space is filled with a predetermined gas, which may be helium, nitrogen or other gas that exhibits minimal expansion and/or contraction over the operating temperature of an exemplary ID tag 10. An antenna system or portion 41 comprises an antenna substrate 42 and an antenna element 44. The antenna substrate 42 is made of a high-k dielectric that in some embodiments comprises a ceramic material. The bottom side or underside of the antenna portion 41 of the antenna substrate 42 is affixed to the top side of the dielectric disk 38. On the top surface of the antenna substrate 42, an antenna element 44 is fixably attached the antenna substrate 42 and is electrically grounded to the base 14 via a continuous or non-continuous weld 46 that extends around at least a portion of the periphery of the antenna portion 41 such that the outer edge of antenna element 44 is electrically connected to the top edge or inner surface of the cylindrical side wall 24 by the weld 46. FIG. 3 depicts an exemplary embodiment wherein the weld 46 is about at least a portion of the top edge of the cylindrical side wall 24 because the antenna element 44 is substantially coplanar with the top edge of the cylindrical side wall 24. As shown, the hermetically sealed inner cavity 43 is substantially filled with elements thereby being substantially a monolithically solid with the exception of a one to two micron space about a SAW piezoelectric device positioned within indention 40.

In varying embodiments, the radome 12 and the base structure 14 may be hermetically sealed by a method of, but not limited to, over molding the radome 12 into the position as shown or pressure fitting the radome such that it overlaps the exterior surface of the cylindrical side wall 24 and is positioned over the o-ring or compression ring 32.

Figure 4:
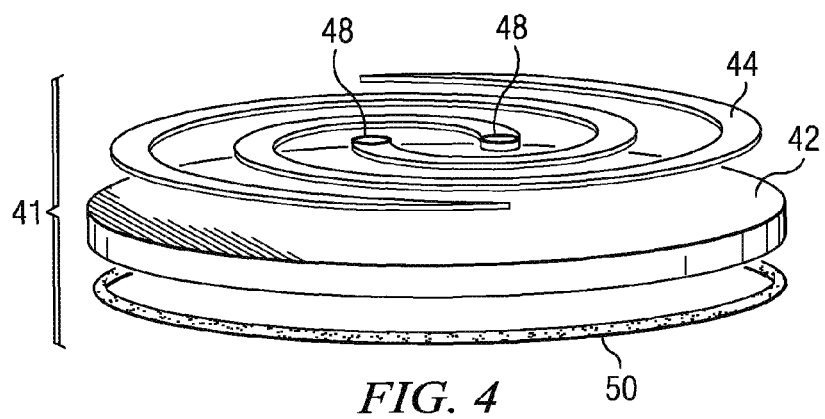
FIG. 4 depicts an exploded view drawing of an exemplary antenna portion of an exemplary ID tag.
Figure 6:
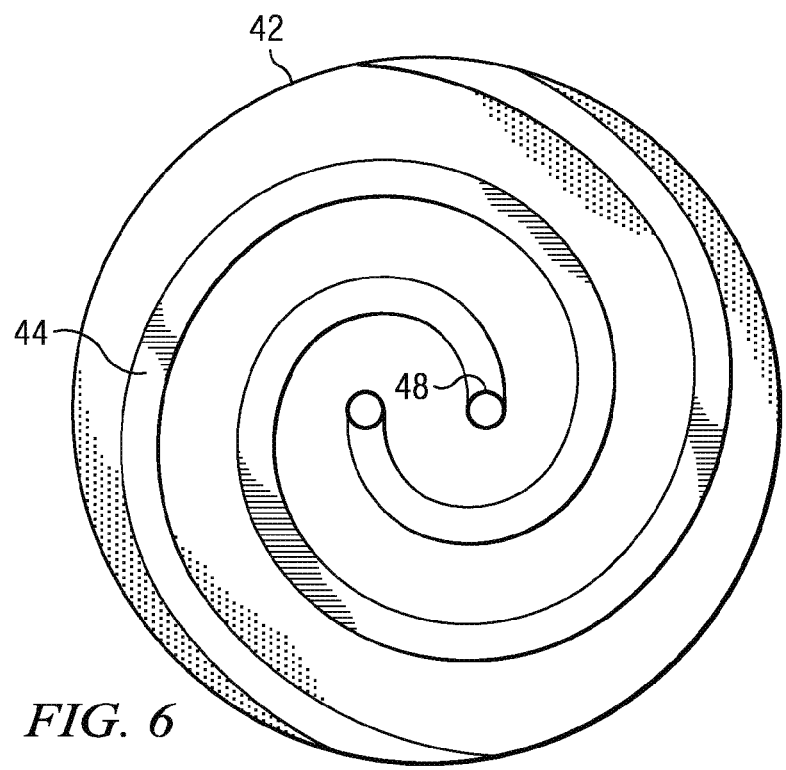
FIG. 6 depicts a top view of an antenna portion in accordance with an embodiment of the invention.
Figure 7:
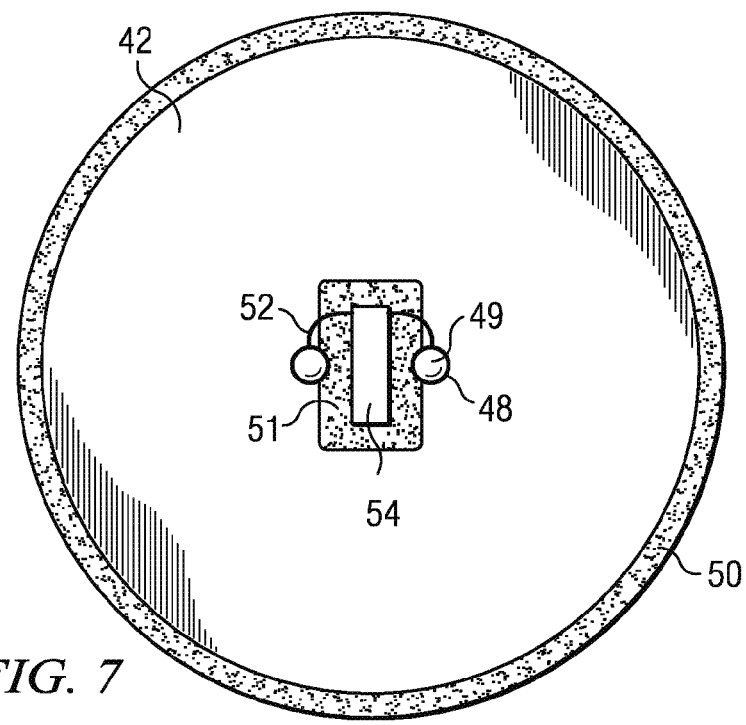
FIG. 7 depicts the bottom side of an antenna portion in accordance with an embodiment of the invention.

Referring now to FIG. 4, an exploded perspective view of an exemplary antenna system or portion 41 is depicted. FIGS. 6 and 7 depict a top and bottom view of the antenna portion 41. Referring now to these three FIGS. 4, 6 and 7, the antenna system or antenna portion 41 comprises an active antenna element 44, which is laminated to the upper top surface of the antenna substrate 42. The antenna element 44 is shown to be a spiral antenna yet other exemplary embodiments may comprise other suitable antennas that include, but are not limited to, ceramic patch antennas, flat panel antennas, monopole antennas, dipole antennas, C-slot antennas, E-slot antennas, microchip antennas, patch antennas, choke ring antennas, etc. On the bottom side of the antenna substrate 42, the bonding agent 50 is positioned about the bottom peripheral surface of the antenna substrate 42. The bonding agent 50 affixes or attaches the bottom surface of the antenna substrate 42 to the top surface of the dielectric disk 38. The bonding agent 50 may comprise an epoxy, heat weld or other substance that will hold the parts together and is not metallic and has similar heat expansion characteristics as the ceramic disk 38 and/or antenna substrate 42. One or more vias or conductive fillets 48 extend from the top to the bottom surfaces of the antenna substrate 42. An RFID device, such as a SAW device 54, is affixed to the bottom surface of the antenna substrate 42. The RFID device or SAW device 54 is positioned such that the bottom surface of the antenna substrate 42 is affixed to the top surface of the ceramic disk or antenna refractor 38, the RFID or SAW device 54 is positioned to be in the indentation 40 on the top surface of the antenna refractor or dielectric disk 38. The bonding agent 51, which may be the same or different as the bonding agent 50 is used to attach or affix the RFID or SAW device 54 to the bottom surface of the antenna substrate 42. The SAW device 54 is attached to the antenna element 44 by bonding wires 52 that extend from the SAW device 54 through the one or more vias 48 to the top surface of the antenna substrate 42 such that they are electrically connected via solder or otherwise to the antenna element or elements 44. During the soldering process the via or vias 48 may be filled or plugged with solder 49. The plugging of the vias seals and stops the predetermined gas from escaping from the one to two micron spatial distance between the SAW device and the boundaries created by the indention 40 in a top surface of the dielectric disk 38. The bonding agent 50 about the bottom peripheral surface of the antenna substrate 42 and top peripheral surface of the dielectric disk 38, also seals and stops the predetermined gas (not specifically shown) from escaping from the one to two micron spaced area between the SAW device 54 and the indention 40.

Figure 5:
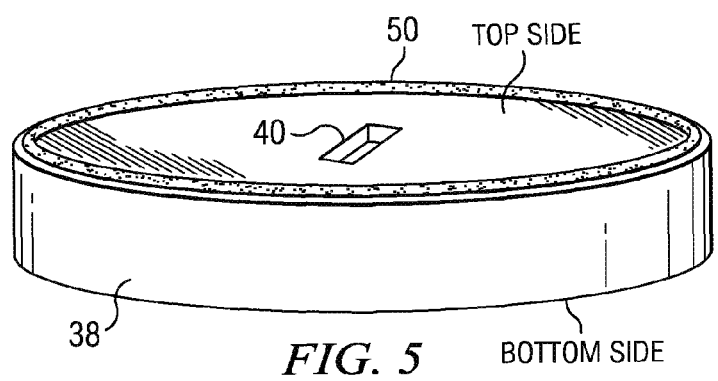
FIG. 5 depicts an exemplary circular dielectric disk portion in accordance with an embodiment of the invention.

Referring now to FIG. 5, a perspective view of the dielectric disk 38 is shown. The dielectric disk 38 is comprised of a ceramic high-K dielectric material. The top surface of the dielectric disk 38 has an indention 40, which is sized to closely fit about the RFID or SAW device 54 while leaving a one to two micron space therebetween when the ID tag 10 is assembled. A bonding agent 50 may be applied about the top surface of the dielectric disk 38 such that the bonding agent forms a ring near or spaced from the peripheral edge of the top surface.

Referring back to FIG. 3, it is important to note that the antenna element 44 is spaced, via the antenna substrate 42 and the dielectric disk 38, from the inner portion bottom 22 of the base portion 14. This spaced configuration allows the dielectric disk 38 and the inner walls of the cylindrical side wall in combination with the inner portion bottom 22 to operate as an antenna signal reflector that will aid in reflecting RF signals received through the top surface 13 of the radome 12 toward the antenna element 44 as well as help direct transmitted RF signals from the antenna element 44 directionally out of the top surface 13 of the radome 12.

Figure 8:
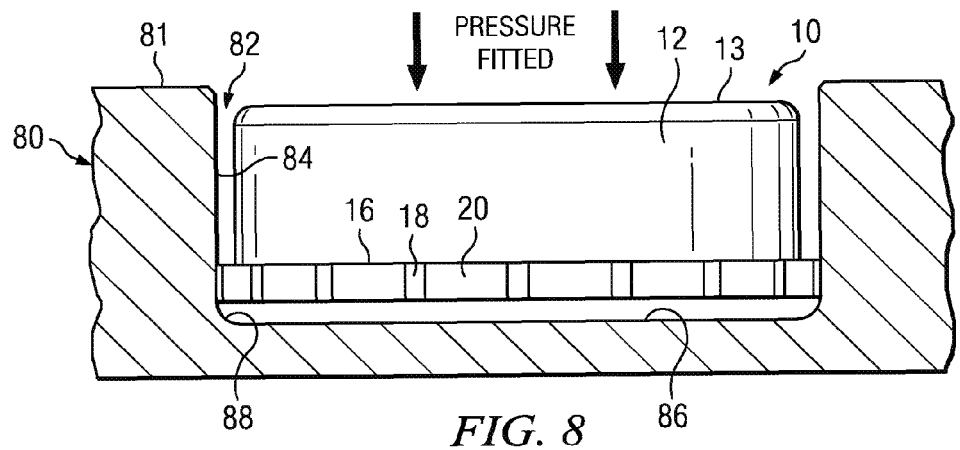
FIGS. 8 and 9 depict a side and top view, respectively, of an exemplary asset comprising an exemplary ID tag installed therein in accordance with an embodiment of the invention.
Figure 9:
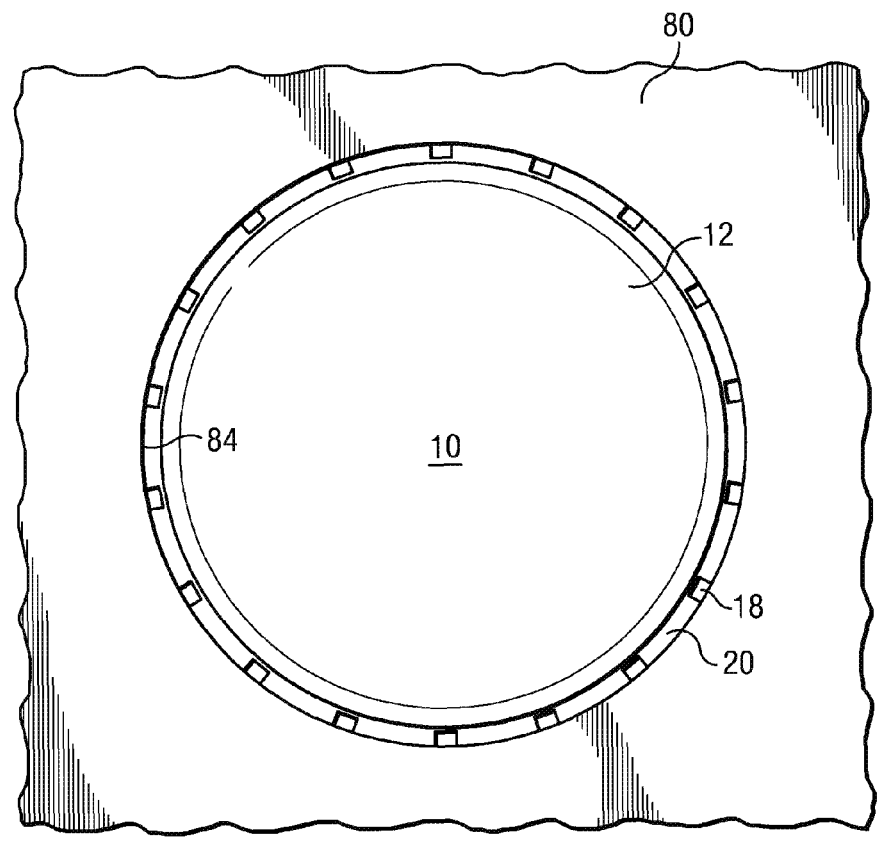

Referring now to FIGS. 8 and 9, a side view and top view, respectively, depict an exemplary ID tag 10 pressed or pressure fitted into an orifice 82. The orifice 82 extends into the exterior surface 81 of an asset 80. The orifice 82 may have been milled into the exterior surface of an asset 80. The asset being a down-hole tool such as a tubular, mud motor, battery pack, drill bit, collar, or other down-hole tool asset. The lip or flange 16 of the base portion 14 is firmly engaged against the orifice side wall 84. The pressure fitted engagement of the side surface of the lip or flange 16 is created at the outer edge of each lip section 20 where it engages the orifice side wall 84. The orifice bottom surface 86 meets with the orifice side wall 84 via a curved corner 88 that extends about the periphery of the bottom of the orifice 82. The bottom side of the base of the ID tag 10 is positioned to be spaced proximate to the orifice bottom surface 86. The top surface 13 of the radome 12 should be planar with or spaced proximately below the exterior surface 81 of the asset 80. Furthermore, the cylindrical sides 11 of the radome 12 are spaced proximate from the orifice side wall 84. The pressure normalization channels or notches 18, formed in the lip 16, aid in normalizing the pressure from behind or under an installed ID tag 10 in the environment that an exemplary ID tag 10 is being used in. The pressure normalization channels or notches 18 allow fluid or gas to move inward or outward therethrough to normalize the pressure underneath or behind an installed ID tag 10 and the environment above the ID tag and about the asset's exterior surface 81. Without these pressure normalization channels or notches 18, an exemplary ID tag 10 may explosively "pop" out of a milled orifice cylinder 82 as the asset endures the extreme pressure changes between a surface of an oil drilling rig and the pressures endured thousands of feet below the earth's crust and back again. Exemplary embodiments are designed to withstand about 20,000 psi of hydrostatic pressure. It is easy to understand the need for the normalization channels or notches 18 so that the high pressure build up underneath the pressure fitted ID tag does not "pop" in an exemplary ID tag 10 out of the milled orifice cylinder 82 as the asset returns from the high pressure depths of the earth back to a much lower pressure environment at the earth's surface.

The advantages associated with invention embodiments are that the ID tag thickness can be decreased from about 0.5" to a range of between about 0.380" to about 0.25" thick. Furthermore, because of the antenna placement and the creation of the antenna reflector spaced below the exemplary antenna element, ID tag embodiments provide an improved readability performance by reducing signal losses by an estimated 0.5 to 1.0 db. Additionally, embodiments can be manufactured at a reduced cost from previously known RFID tag devices because of the minimal number of components combined with the simplicity and minimal number of manufacturing steps needed to manufacture an exemplary ID tag. Furthermore, with the simplified internal design and minimized number of parts, the physical strength and endurance of resulting exemplary ID tag is capable of withstanding pressures ranging from atmospheric to over 25,000 psi and temperatures up to and including about 400° C. Exemplary SAW piezoelectric RFID tags can be installed into the asset surfaces of various types of tools including tubulars, pipe and other equipment that may be used in down-hole or other extreme environment applications.

Figure 10:
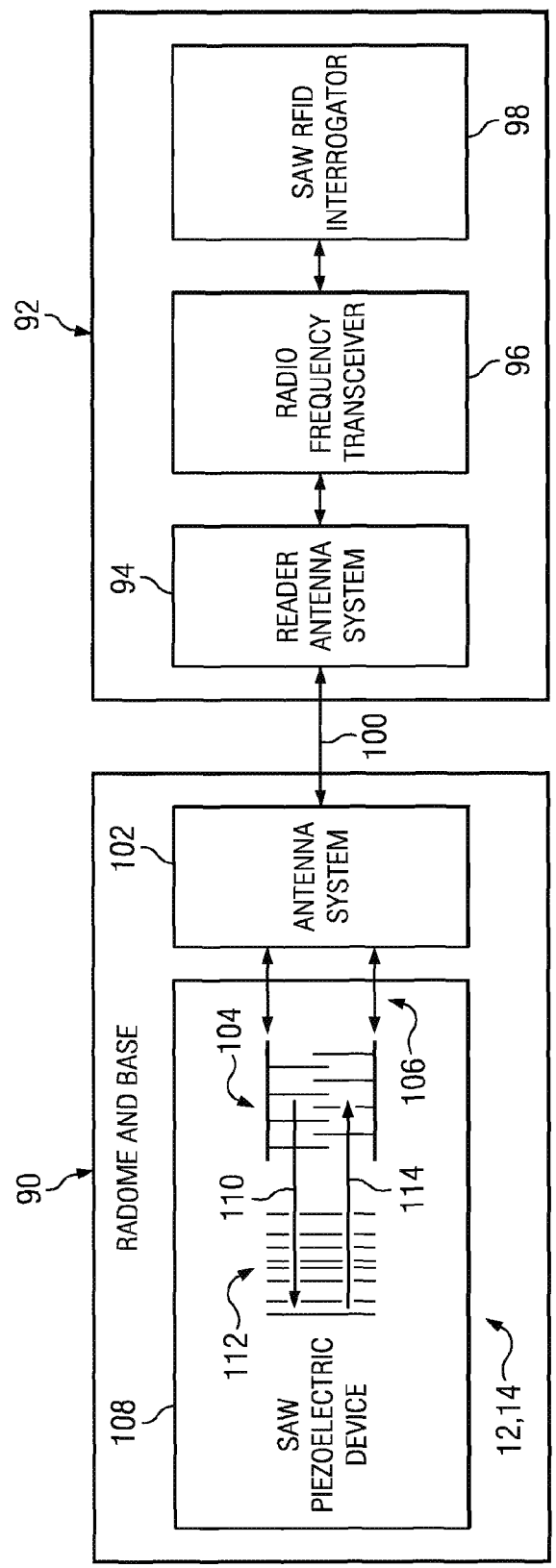
FIG. 10 is a schematic block diagram of an exemplary communication system and method between an exemplary SAW piezoelectric transponder ID tag and an external SAW interrogation system in accordance with an embodiment of the invention.

FIG. 10 illustrates a flow diagram of an exemplary system that utilizes a SAW piezoelectric device installed in an ID tag for use as a transponder. Here a surface acoustic wave transponder ID tag 90 is depicted interacting with a surface acoustic wave reader or interrogator device 92. A SAW reader or interrogator device 92 may comprise, for example, an antenna system 94, a radio frequency transceiver 96 and a surface acoustic wave radio frequency interrogator 98. Radio frequency energy 100 is exchanged between the transponder antenna system 102 and the reader antenna system 94. The radio frequency energy received at the transponder antenna system 102 is fed to a surface acoustic wave (SAW) inter-digital transducer 104 via connections 106. The connections 106 may coincide, for example, to the bonding wire 52 that electrically connect the exemplary antenna element 44 to the SAW device 54 in an exemplary embodiment. In the SAW piezoelectric device 108, the inter-digital transducer 104 converts the radio frequency energy to a surface acoustic wave 110 (shown as an arrow in the figure), which propagates over the delay lines 112. The delay lines encode the surface acoustic wave 10 into a return signal or data 114. The encoded return signal or data 114 is then converted back into radio frequency energy via the inter-digital transducer 104. The return signal or data in the form of radio frequency energy is then provided to the antenna system 102 via connections 106 and transmitted as a radio frequency 100 back to the reader antenna system 94. The radio frequency transceiver 96 receives the encoded return signal, which is then provided to the SAW RFID interrogator 98 where the encoded return signal is decoded for use by other electronic devices such as an asset inventory system.

Although illustrated embodiments of the invention have been described, the foregoing description is not intended to limit the scope of the invention. Various modifications and combinations of the invention embodiments as well as other embodiments of invention will be apparent to persons skilled in the art upon reference to the description. It is therefore intended that the appended claims incorporate any such modifications or embodiments.

It will be appreciated by those skilled in the art having the benefit of this disclosure that this surface acoustic wave transponder package for down-hole applications provides an improved down-hole asset tagging device package that can withstand the high pressures and temperatures, as well as the caustic environment of a down-hole environment while providing a means for containing an accurate RFID or SAW RFID device that can be easily read to help account for asset usage and inventory. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace

What is claimed is:

1. A transponder device comprising:
   a radome having cylindrical sides and a top forming an inner radome cavity;
   a metallic base portion comprising:
      a circular base bottom;
      a notched flange about the circumference of the base bottom; and
      a cylindrical sidewall extending upward from the circular base bottom, the cylindrical sidewall and the cylindrical sides concentrically overlapping to form an inner cavity;
   a circular dielectric disk, positioned inside the inner cavity, having a first side proximate to an inner portion bottom of the inner cavity and a second side including a recess having 5 bounded walls and an open face in substantially the center thereof;
   an antenna portion comprising:
      a dielectric antenna substrate having an underside affixed to the second side of the circular dielectric disk;
      an antenna element on a top side of the dielectric substrate; and
      a first via and a second via, each extending from the top side of the dielectric substrate through to a bottom side of the dielectric substrate;
      a surface acoustic wave (SAW) piezoelectric device mounted on the underside of the dielectric antenna substrate and positioned in substantially the center thereof such that, when the dielectric antenna substrate is disposed adjacent the circular dielectric disk, the SAW is disposed within the open face of the recess and at or below the plane of the second side of the circular dielectric disk and away from the five bounded walls thereof, the SAW piezoelectric device being electrically connected to the antenna element through the first and the second vias; and
      a conductive peripheral weld about at least some of the circumference of the antenna portion, the conductive peripheral weld electrically connecting the antenna element and the cylindrical sidewall.

2. The transponder device of claim 1, further comprising a gas in the recess, the gas providing a means for an acoustic wave to propagate on the SAW piezoelectric device.

3. The transponder device of claim 1, wherein the inner cavity is hermetically sealed.

4. The transponder device of claim 1, wherein the combination of the circular dielectric disk and the inner portion bottom of the inner cavity are adapted to operate as a directional antenna reflector.

5. The transponder device of claim 1, further comprising a means for sealing between the concentrically overlapping cylindrical portion and the cylindrical sides.

6. The transponder of claim 5, wherein the means for sealing comprises an o-ring.

7. The transponder of claim 1, wherein the SAW piezoelectric device is mounted to the underside of the dielectric antenna substrate using a bonding agent.

8. The transponder of claim 1, wherein the dielectric antenna substrate underside is affixed to the second side of the circular dielectric disk with a peripherally positioned bonding agent therebetween.

9. A transponder device comprising:
   a hermetically sealed cavity comprising a radome top portion and a metallic base portion;
   a dielectric disk, positioned adjacent to the base portion inside the hermetically sealed cavity, the top side of the dielectric disk comprising a recess with five bounded walls and an open face;
   an antenna portion comprising:
      an antenna element layer;
      a dielectric substrate layer under the antenna element layer;
      at least one via extending from a dielectric substrate layer bottom side to a dielectric substrate layer top side;
      a radio frequency transponder device mounted on the dielectric substrate layer bottom side and disposed in the recess and spaced away from the five bounded walls and at or below the plane of the dielectric disk, the radio frequency transponder device being electrically connected to the antenna element layer through the at least one via;
      wherein the dielectric substrate layer bottom side is attached to the top side of the dielectric disk such that the radio frequency transponder device is positioned in the indentation together with a predetermined gas.

10. The transponder device of claim 9, wherein the radome top portion and the metallic base portion combine to comprise a substantially cylindrical shape.

11. The transponder device of claim 9, further comprising a circumferential lip about the base portion.

12. The transponder device of claim 11, wherein the circumferential lip comprises a plurality of spaced notches.

13. The transponder device of claim 9, wherein the combination of the dielectric disk and the base portion inside the hermetically sealed cavity are adapted to operate as a directional antenna signal reflector.

14. The transponder device of claim 9, further comprising an electrical connection between the antenna element layer and the metallic base portion.

15. A down-hole asset comprising:
   an annular aperture in an outer surface of the down hole asset; and
   a transponder device fitted into the annular aperture, the transponder device comprising:
      a radome having cylindrical sides and a top forming an inner radome cavity;
      a metallic base portion comprising:
         a circular base bottom;
         a notched flange about the circumference of the base bottom, the notched flange engaged with an inside wall of the annular aperture; and
         a cylindrical sidewall extending upward from the circular base portion, the cylindrical sidewall and the cylindrical sides concentrically overlapping to form an inner cavity;
      a circular dielectric disk, positioned inside the inner cavity, having a first side proximate to an inner portion bottom of the inner cavity and a second side comprising a recess having five bounded walls and an open face;
      an antenna portion comprising:
         a dielectric antenna substrate having an underside affixed to the second side of the circular dielectric disk;
         an antenna element on a top side of the dielectric substrate; and a first via and a second via, each extending from the top side of the dielectric substrate to a bottom side of the dielectric substrate;

a surface acoustic wave (SAW) piezoelectric device mounted on the underside of the dielectric antenna substrate and positioned in the recess through the open face at or below the plane of the second side of the circular dielectric disk and spaced away from the five bounded walls, the SAW piezoelectric device being electrically connected to the antenna element through the first and the second vias; and a conductive peripheral weld about at least some of the circumference of the antenna portion, the conductive peripheral weld electrically connecting the antenna element and the cylindrical sidewall.

16. The transponder device of claim 15, further comprising a gas in the recess, the gas providing a means for an acoustic wave to propagate on the SAW piezoelectric device.

17. The transponder device of claim 15, wherein the inner cavity is hermetically sealed.

18. The transponder device of claim 15, wherein the combination of the circular dielectric disk and the inner portion bottom of the inner cavity are adapted to operate as a directional antenna reflector.

19. The transponder device of claim 15, further comprising a means for sealing between the concentrically overlapping cylindrical sidewall and the cylindrical sides.

* * * * *